(12) United States Patent
Lee et al.

(10) Patent No.: US 9,337,241 B2
(45) Date of Patent: May 10, 2016

(54) PIXEL PATTERNS FOR ORGANIC LIGHT-EMITTING DIODE DISPLAY

(71) Applicant: Apple Inc., Cupertino, CA (US)

(72) Inventors: Jungmin Lee, Cupertino, CA (US); ChoongHo Lee, Cupertino, CA (US); Jinkwang Kim, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/498,950

(22) Filed: Sep. 26, 2014

(65) Prior Publication Data

US 2015/0270317 A1    Sep. 24, 2015

Related U.S. Application Data

(60) Provisional application No. 61/955,506, filed on Mar. 19, 2014.

(51) Int. Cl.
*H01L 29/08* (2006.01)
*H01L 35/24* (2006.01)
*H01L 27/32* (2006.01)

(52) U.S. Cl.
CPC .................................. *H01L 27/3218* (2013.01)

(58) Field of Classification Search
USPC .................. 257/40, 642, 643, 759, 257/E51.001–E51.052, E25.008–E25.009; 438/29, 69, 82, 99, 27
See application file for complete search history.

(56) References Cited

U.S. PATENT DOCUMENTS

| | | | |
|---|---|---|---|
| 8,421,820 B2 | 4/2013 | Brown Elliott et al. | |
| 8,576,311 B2 * | 11/2013 | Okumura | H04N 5/3741 348/273 |
| 8,587,742 B2 | 11/2013 | Kimura et al. | |
| 8,736,518 B2 | 5/2014 | Park et al. | |
| 2004/0246426 A1 | 12/2004 | Wang et al. | |
| 2008/0128598 A1 * | 6/2008 | Kanai | H01L 27/14621 250/226 |
| 2012/0049726 A1 * | 3/2012 | Yoo | H01L 27/3213 313/504 |
| 2013/0320367 A1 * | 12/2013 | Hong | H01L 27/3211 257/89 |
| 2013/0334507 A1 * | 12/2013 | Shimoji | F21V 9/08 257/40 |
| 2014/0077186 A1 * | 3/2014 | Kim | H01L 27/3218 257/40 |
| 2014/0231788 A1 | 8/2014 | Krall et al. | |
| 2014/0354701 A1 * | 12/2014 | Yeo | G09G 3/3208 345/690 |

* cited by examiner

*Primary Examiner* — Dao H Nguyen
*Assistant Examiner* — Tram H Nguyen
(74) *Attorney, Agent, or Firm* — Treyz Law Group, P.C.; G. Victor Treyz; Zachary D. Hadd

(57) ABSTRACT

An electronic device may include a display having an array of organic light-emitting diode display pixels. The display pixels may have subpixels of different colors. The subpixels may include red subpixels, green subpixels, and blue subpixels. The subpixels may be provided with shapes and orientations that improve manufacturing tolerances. Subpixels such as green and red subpixels may have hexagonal shapes while blue subpixel structures may be provided with diamond shapes coupled in pairs to form barbell-shaped blue subpixels. Subpixels can also be angled at 45° relative to horizontal. Subpixels ma have shapes that overlap adjacent display pixels. For example, an array of display pixels that has been rotated by 45° relative to the edges of a display substrate may have blue subpixels and or red subpixels that are shared between pairs of adjacent display pixels in an at of display pixels.

17 Claims, 11 Drawing Sheets

PIXEL PATTERNS FOR ORGANIC LIGHT-EMITTING DIODE DISPLAY

This application claims the benefit of provisional patent application No. 61/955,506 filed Mar. 19, 2014, which is hereby incorporated by reference herein in its entirety.

BACKGROUND

This relates generally to electronic devices and more particularly, to electronic devices with organic light-emitting diode displays.

Electronic devices often include displays. For example, an electronic device may have an organic light-emitting diode display with an array of display pixels. The display pixels may have subpixels. The subpixels of a display pixel may emit light of different colors. As an example, each pixel in a display may have a red subpixel a green subpixel, and a blue subpixel, There are challenges associated with optimizing display performance in an organic light-emitting diode display. If care is not taken, pixel pitch will be low, pixel apertures will be small, and light emitting efficiency will be poor.

It would therefore be desirable to be able to provide improved displays such as improved organic light-emitting diode displays.

SUMMARY

An electronic device may include a display having an array of organic light-emitting diode display pixels. The display pixels may have subpixels of different colors. The subpixels may include red subpixels, green subpixels, and blue subpixels, The subpixels may be provided with shapes and orientations that improve manufacturing tolerances.

With one embodiment, subpixels such as green and red subpixels have hexagonal shapes while blue subpixels are provided with diamond shapes coupled in pairs to form barbell-shaped subpixels. The green and red subpixels in this type of arrangement can be vertically positioned in alignment with coupling paths in the centers of the blue barbell-shaped subpixels that are being used to couple together pairs of diamond-shaped blue subpixel structures.

With another embodiment, display pixels and the subpixels in the display pixels are angled at 45° relative to horizontal. Subpixels in this type of configuration may have shapes that overlap adjacent display pixels. For example, an array of display pixels that has been rotated by 45° relative to the edges of a display substrate may have blue subpixels and/or red subpixels that are shared between pairs of adjacent display pixels in an array of display pixels while having green subpixels that are driven independently and that are not shared between adjacent display pixels.

DETAILED DESCRIPTION

Figure 1:
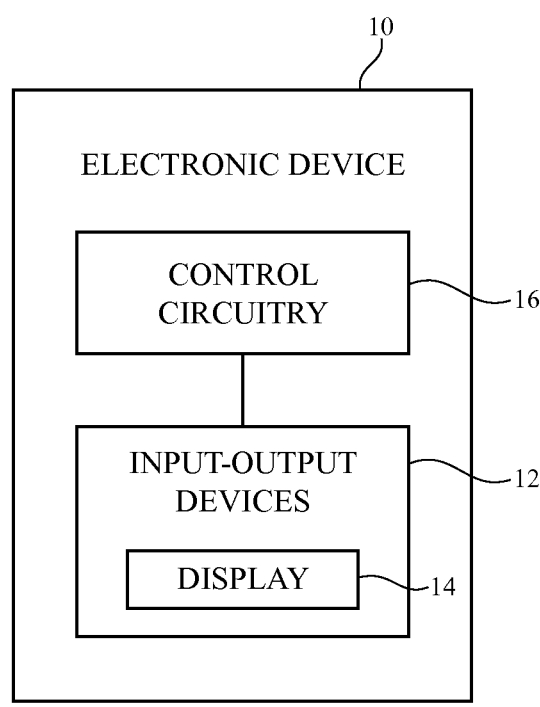
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio codec chips, application specific integrated circuits, etc.

Input-output circuitry in device 10 such as input-output devices 12 ma be used to allow data to be supplied to device 10 and to allow data to be provided from device 10 to external devices. Input-output devices 12 may include buttons, joysticks, click wheels scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12, and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 in input-output devices.

Display 14 may be an organic light-emitting diode display. As shown in the illustrative diagram of FIG. 2, display 14 may include layers such as substrate layer 24, Layers such as substrate 24 may be formed from planar rectangular layers of material such as planar glass layers, planar polymer layers, composite films that include polymer and inorganic materials, metallic foils, etc. Substrate 24 may have left and right vertical edges and upper and lower horizontal edges.

Figure 2:
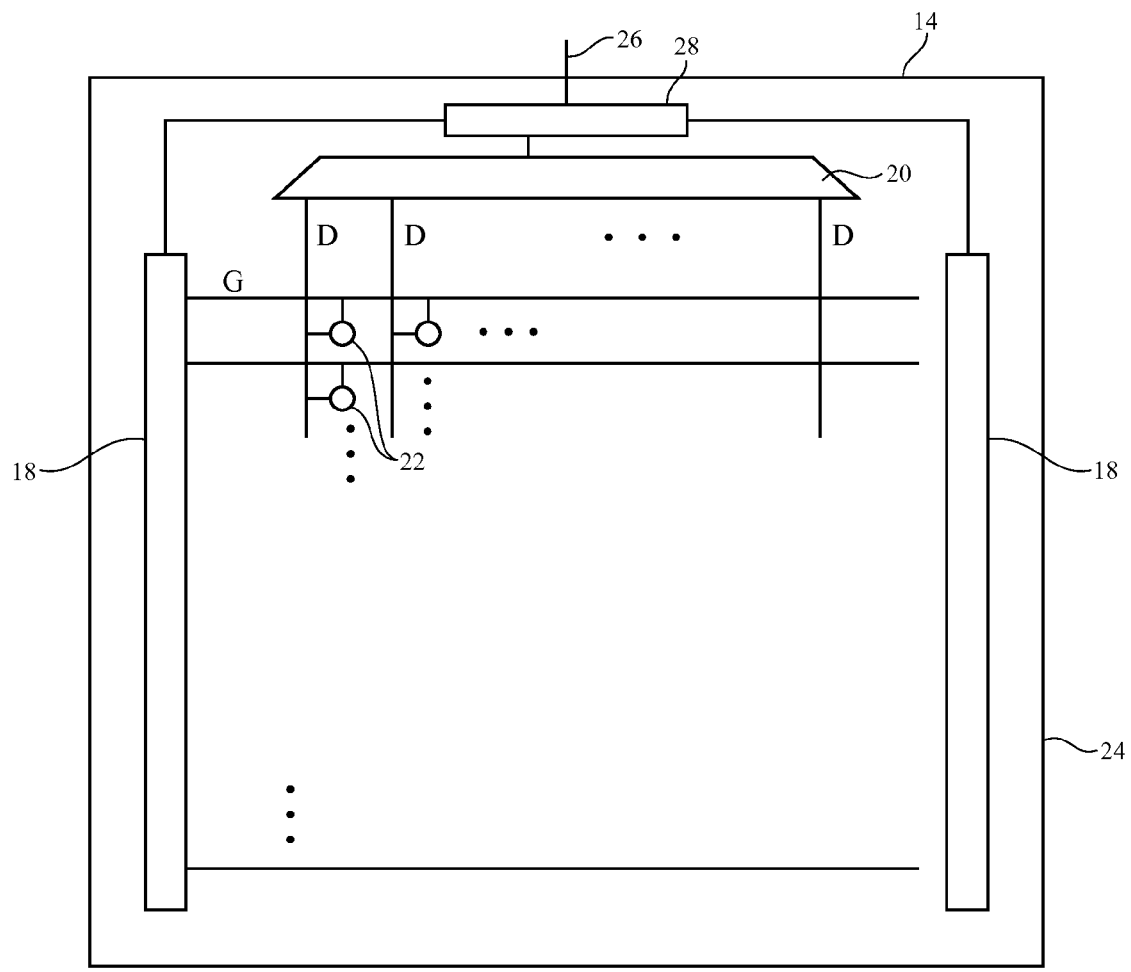
FIG. 2 is a diagram of art illustrative organic light-emitting diode display in accordance with an embodiment.

Display 14 may have an array of display pixels 22 for displaying images for a user. The array of display pixels 22 may be formed from rows and columns of display pixel structures (e.g. display pixels formed from structures on display layers such as substrate 24). There may be any suitable number of rows and columns in the array of display pixels 22 (e.g., ten or more one hundred or more, or one thousand or more). In some embodiments, the rows and columns may run diagonally (i.e., the array may be angled at 45° relative to horizontal so that the display pixels extend along axes that are angled at 45° relative to the vertical and horizontal edges of the display substrate). The configuration of FIG. 2 is merely illustrative.

Display driver circuitry such as display driver integrated circuit(s) 28 may be coupled to conductive paths such as metal traces on substrate 24 using solder or conductive adhesive. Display driver integrated circuit 28 (sometimes referred to as a timing controller chip) may contain communications circuitry for communicating with system control circuitry over path 26. Path 26 may be formed from traces on a flexible printed circuit or other cable. The control circuitry may be located on a main logic board in an electronic device in which display 14 is being used During operation, the control circuitry on the logic board (e.g., control circuitry of FIG. 1) may supply control circuitry such as display driver integrated circuit 28 with information on images to be displayed on display 14. Circuitry such as display driver integrated circuits may be mounted on substrate 24 or may be coupled to substrate 24 through a flexible printed circuit cable or other paths.

To display the images on display pixels 22, display driver integrated circuit 28 may supply corresponding image data to data lines D while issuing clock signals and other control signals to supporting thin-film transistor display driver circuitry such as gate driver circuitry 18 and demultiplexing circuitry 20.

Gate driver circuitry 18 (sometimes referred to as scan line driver circuitry) may be formed on substrate 24 (e.g., on the left and right edges of display 14, on only a single edge of display 14, or elsewhere in display 14). Demultiplexer circuitry 20 may be used to demultiplex data signals from display driver integrated circuit 28 onto a plurality of corresponding data lines D. With this illustrative arrangement of FIG. 1, data lines D run vertically through display 14. Data lines D are associated with respective columns of display pixels 22. There may be distinct data lines D for each of the subpixels in a display pixel 22. For example, in a display pixel that has separately controlled red, green, and blue subpixels, there may be three corresponding data lines for carrying respective red, green, and blue data.

Gate lines G (sometimes referred to as scan lines) run horizontally through display 14, Each gate line G is associated with a respective row of display pixels 22. If desired, there may be multiple horizontal control lines such as gate lines G associated with each row of display pixels. Gate driver circuitry 18 may be located on the left side of display 14, on the right side of display 14, or on both the right and left sides of display 14, as shown in FIG. 2.

Gate driver circuitry 18 may assert horizontal control signals (sometimes referred to as scan signals or gate signals) on the gate lines G in display 14. For example, gate driver circuitry 18 may receive clock signals and other control signals from display driver integrated circuit 28 and may, in response to the received signals, assert a gate signal on gate lines G in sequence, starting with the gate line signal G in the first row of display pixels 22. As each gate line is asserted, data from data lines D is located into the corresponding row of display pixels, In this way, circuitry 28, 20, and 18 may provide display pixels 22 with signals that direct display pixels 22 to generate light for displaying a desired image on display 14. More complex control schemes may be used to control display pixels with multiple thin-film transistors (e.g., to implement threshold voltage compensation schemes) if desired.

Display driver circuitry such as demultiplexer circuitry 20 and gate line driver circuitry 18 may be formed from thin-film transistors on substrate 24. Thin-film transistors: may also be used in forming circuitry in display pixels 22. The thin-film transistors in display 14 may, in general, be formed using any suitable type of thin-film transistor technology (e.g., silicon-based, semiconducting-oxide-based, etc.).

Figure 3:
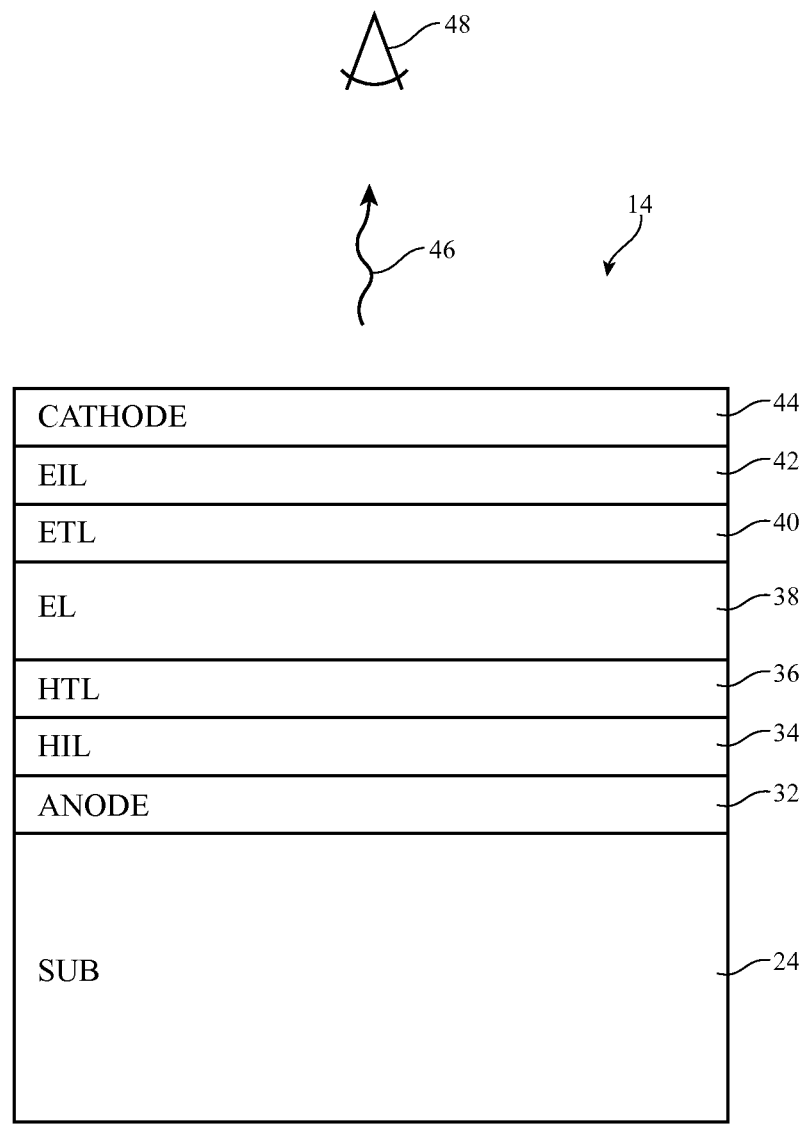
FIG. 3 is a cross-sectional side view of a portion of an illustrative organic light-emitting diode display in accordance with an embodiment.

If desired, data lines D and gate lines G may be angled relative to the edges of substrate 24. For example, data lines D and gate lines G may be angled at 45° relative to horizontal in a display configuration in which display pixels 22 are angles at 45° relative to horizontal. The use of vertical data lines D and horizontal gate lines G in the example of FIG. 2 is merely illustrative, A cross-sectional side view of a configuration that may be used for the pixels of display 14 of device 10 is shown in FIG. 3. As shown in FIG. 3, display 14 may have a substrate such as substrate 24. Substrate 24 may be formed from a material such as glass or other dielectric. Anode 32 may be formed from a layer of indium tin oxide or other conductive material on the surface of substrate 30. Cathode 44 may be formed at the top of display 14. Cathode may be formed from a conductive layer such as a layer of metal that is sufficiently thin to be transparent (i.e., sufficiently transparent to allow light 46 that is emitted from display 14 to travel upward towards viewer 48).

The layers of material between cathode 44 and anode 32 form as light-emitting diode. These layers may include layers such as electron injection layer 42, electron transport layer 40, emissive layer 36, hole transport layer 34, and hole injection layer 34. Layers 42, 40, 38, 36, and 34 may be formed from organic materials. Emissive layer 38 is an electroluminescent organic layer that emits tight 46 in response to applied current.

Each display pixel 22 in display 14 may contain multiple subpixels. The subpixels may have emissive layers 38 that emit light 46 of different colors. For example, each display pixel may have a red subpixel with an emissive layer 36 that emits light 46 that is red, may have a blue subpixel with an emissive layer 36 that emits light 46 that is blue, and may have a green subpixel with an emissive layer 36 that emits light that is green. If desired, each display pixel 22 may have a set of four subpixels that emit light in different colors, may include white subpixels, or may include subpixels of other colors. Color may be imparted to subpixels using a color filter layer with color filter elements that overlap the structures of FIG. 3, if desired. The configuration of FIG. 3 in which display 14 is formed from display pixels having subpixels of differently colored emissive layers 38 is merely illustrative.

The sizes and shapes of the subpixels in each display pixel 22 may affect display efficiency. In general, it is desirable for the emissive area of each subpixel (i.e., its anode area and the overlapping emissive layer 38) to be as large as possible. At the same time, subpixels cannot be too large. Unavoidable manufacturing variations may lead to slight misalignment between adjacent subpixels. If subpixels are too large, there will be insufficient separation between adjacent subpixels. This could lead to undesired color mixing due to overlap between adjacent subpixels.

Figure 4:
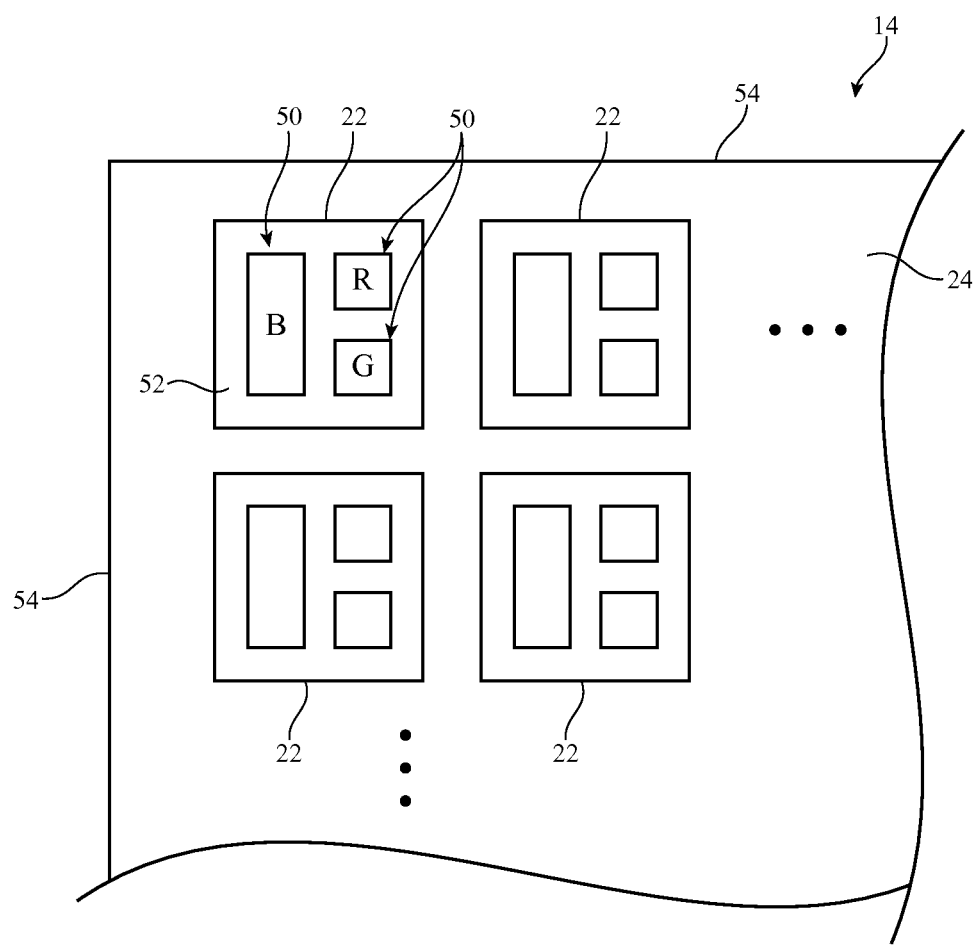
FIG. 4 is a top view of an illustrative organic-light-emitting diode display showing how each display pixel may contain subpixels of different colors in accordance with an embodiment.

An illustrative configuration for display 14 is shown in FIG. 4. As shown in FIG. 4, each display pixel 22 may have three respective subpixels 50 such as a red subpixel R, green subpixel G, and blue subpixel B. The amount of area consumed by each subpixel in a display pixel need not be the same. For example, to balance emissive efficiencies for differently colored subpixels, the areas of the red and green subpixels may be the same, Whereas the blue subpixels may have an area of 2.5 times the area of the red subpixels (as an example). Other subpixel area ratios may be used if desired. The portions of the subpixels that are not covered with emissive material (see, e.g., portion 52 of FIG. 4) may be used for signal paths such as scan lines and data lines (source lines) and for thin-film transistor circuitry (e.g., drivers for controlling current through the light-emitting diodes of the subpixels transistors for implementing threshold voltage compensation circuits, etc.).

Subpixels 50 in the example of FIG. 4 have rectangular outlines and the edges of the subpixels extend vertically and horizontally, parallel to the respective vertical and horizontal edges 52 of display substrate 24 and display 14. With this type of arrangement, misalignment between subpixels can lead to undesired overlap along opposing adjacent subpixel edges. Consider, as an example, adjacent subpixels 50A and 50B of FIG. 5. Due to manufacturing variations, there may be some misalignment between subpixel 50A and subpixel 50B. In particular, subpixel 50A may not be located in its desired position, but rather may be located in the position shown by shifted subpixel 50A of FIG. 5. This may give rise to subpixel overlap region 56. Due to the rectangular shapes of subpixels 50A and 50B in the FIG. 5 example, the overlapped edges of subpixels 50A and 50B extend vertically and overlap area 56 has a rectangular shape.

Figure 5:
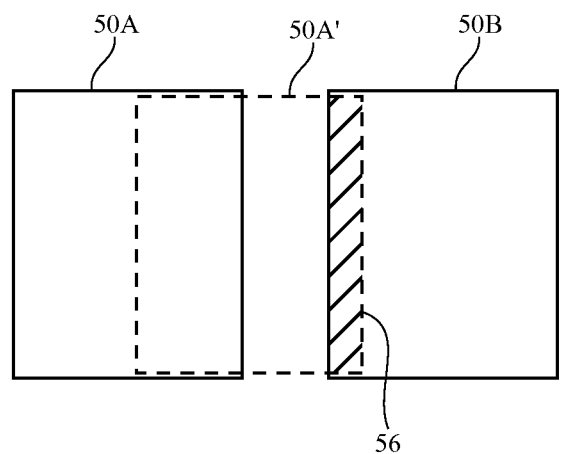
FIG. 5 is a top view of a portion of an illustrative display with rectangular subpixels showing the potential for the edges of adjacent subpixels to overlap due to misalignment during fabrication in accordance with an embodiment.

To reduce the sensitivity of display 14 to subpixel misalignment, subpixels can be provided with shapes and positions other than the vertically and horizontally aligned rectangular subpixel shapes of FIG. 5. As an example, one or more of subpixels 50 may have shapes such as diamonds, hexagons, other shapes with straight edges (e.g., shapes with four or more straight sides, shapes with five or more straight sides, shapes with six or more straight sides, etc.), shapes with curved edges, and for shapes with combinations of straight and curved edges.

Figure 6:
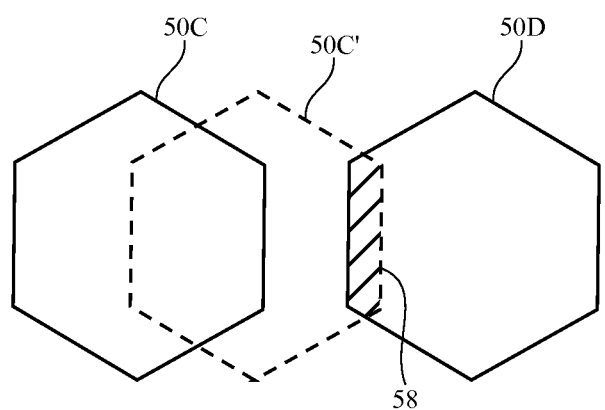
FIG. 6 is a top view of a portion of an illustrative display with hexagonal subpixels showing the potential for certain portions of adjacent subpixels to overlap due to misalignment during fabrication in accordance with an embodiment.

In the illustrative display arrangement of FIG. 6, subpixels have hexagonal shapes. This type of shape may be more tolerant to misalignment for a given anode size (i.e., for a given aperture ratio) than the rectangular shapes of FIG. 5. In the FIG. 6 example. subpixels 50C and 50C are nominally located adjacent to each other without overlapping. However, due to misalignment during manufacturing, subpixel 50C is shifted to position 50C'. This gives rise to overlaps area 58. Due to the non-rectangular shapes of hexagonal subpixels 50C and 50D, overlap area 58 consumes a smaller fraction of the subpixel area in the scenario of FIG. 6 than overlap area 56 consumes in the scenario of FIG. 5. Because the hexagonal subpixel shapes of FIG. 6 are more tolerant of misalignment, the sizes of the anodes and overlapping emissive layers in the subpixels can be increased for a given level of misalignment tolerance, thereby improving efficiency. If desired, pixel pitch may be reduced or misalignment tolerance can be increased instead of or in addition to increasing display efficiency by enhancing subpixel apertures using subpixel shapes of the type shown in FIG. 6.

Figure 7:
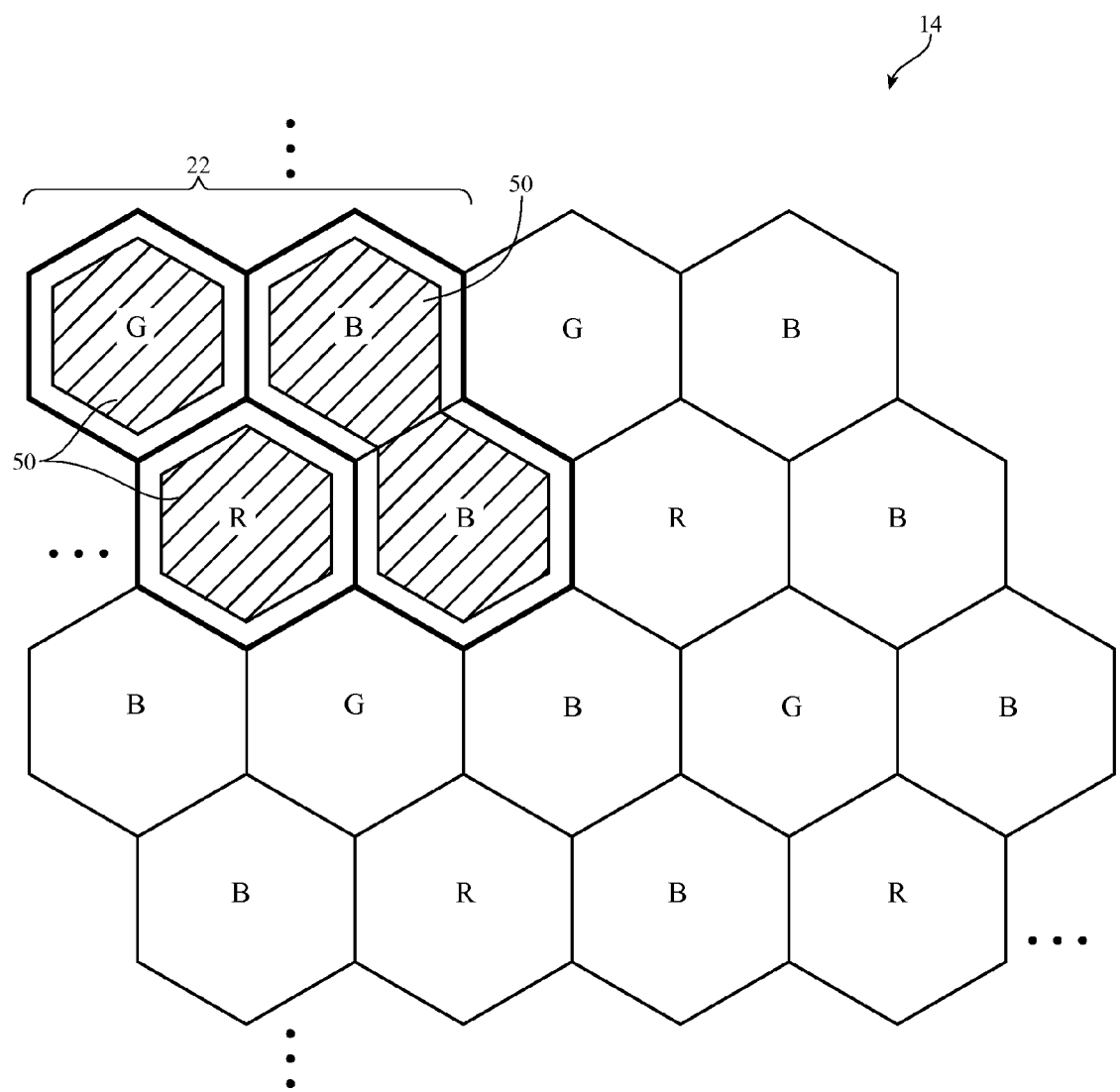
FIG. 7 is a top view of an illustrative display with tiled hexagonal subpixels in accordance with an embodiment.

FIG. 7 shows how display 14 may be populated with a tiled array of hexagonal subpixels 50. In the FIG. 7 example, each display pixel 22 includes a hexagonal green subpixel G, a hexagonal red subpixel R, and a barbell-shaped blue subpixel U formed from a pan of joined adjacent blue hexagonal subpixel structures (e.g., joined adjacent hexagonal anodes and overlapping emissive layer structures that have a narrow connecting "waist" between two larger blue hexagons). The anodes and colored emissive material in these subpixels are preferably recessed from the outermost hexagon edges of the tiles of FIG. 7 to help prevent color mixing due to unavoidable manufacturing variations. Moreover, other display pixel tiling schemes may be used that include hexagonal subpixel structures. The configuration of FIG. 7 is merely illustrative.

Figure 8:
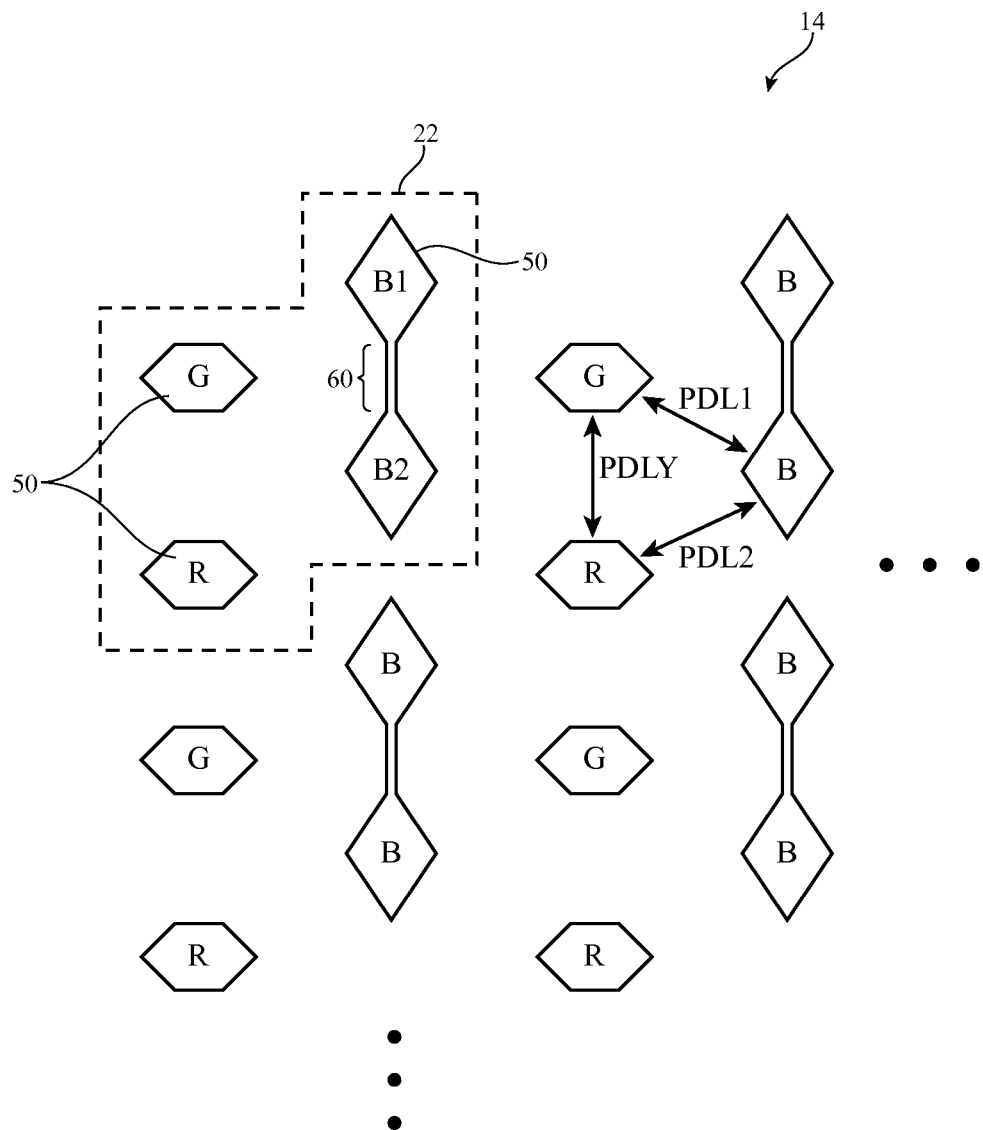
FIG. 8 is a top view of an illustrative display with pairs of diamond-shaped blue subpixel structures that form barbell-shaped blue subpixels and with hexagonal red and green subpixels that are vertically aligned along a shared horizontal axis with the centers of the blue subpixels in accordance with an embodiment.

If desired, diamond subpixel shapes may be incorporated into display 14. An illustrative display 14 that includes diamond subpixel structures is shown in FIG. 8. As shown in FIG. 8, subpixels 50 may include six-sided green subpixels G (e.g., horizontally stretched hexagons) and six-sided red subpixels R (e.g., horizontally stretched hexagons). In addition to a green subpixel G and a red subpixel R, each display pixel 22 may include a blue subpixel formed from a pair of linked blue diamond subpixel structures such subpixel structures B1 and B2. Structures B1 and B2 may be electrically coupled using connector paths such as path 60, so that the blue subpixels have barbell shapes. With this type of arrangement, a respective path 60 (which may or may not be covered by blue emissive material) may be formed in the center of each barbell-shaped blue subpixel. By combining blue subpixel structures B1 and B2, blue light emission is increased to compensate for the lower efficiency of the blue emissive material in the light-emitting diodes relative to the efficiency of the red and green emissive materials.

Each subpixel may be surrounded by a dielectric structure (sometimes referred to as a pixel definition layer). Subpixels 50 are spaced apart from each other satisfactorily when pixel definition layer (PDL) separations PDL1, PDL2, and PDLV are sufficiently large. The use of the layout of FIG. 8 helps ensure that subpixels 50 are well separated from each other and are tolerant of misalignment during, manufacturing. For example, by locating the green subpixels G and the red subpixels R so that they are vertically in alignment with the centers (connectors 60) of the blue subpixels as shown in FIG. 8 (i.e., so that the green and red subpixels share common horizontal axes with respective sets of the centers of the blue subpixels), shifts in the positions of the green and red subpixels relative to the blue subpixels will result in minimal overlap and color mixing. Consider, as an example, a horizontal shift in position of green subpixels G. Because green subpixels G are aligned so that this type of shift would result mostly in overlap with connectors 60 rather than with structures B1 and B2, the opportunity for green/blue color mixing is reduced.

Figure 9:
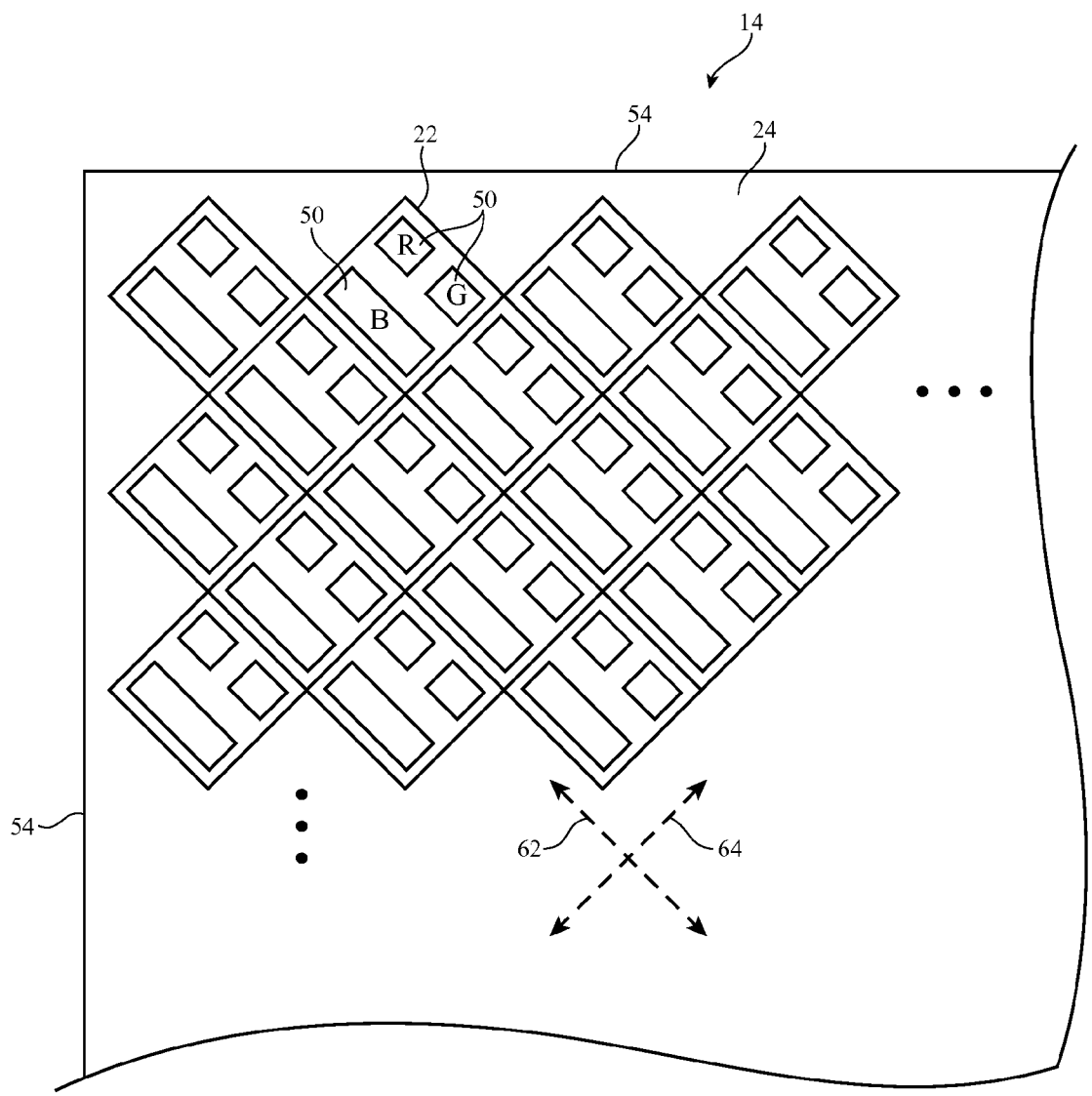
FIG. 9 is a top view of an array of display pixels that has been rotated 45° from horizontal in accordance with an embodiment.

If desired, the array of display pixels 22 in display 14 may be angled at 45° relative to horizontal (and relative to vertical)

to help increase tolerance to subpixel misalignment. This type of configuration is shown in FIG. 9. Rather than having display pixels 22 that are arranged in horizontally extending rows and vertically extending columns, display 14 of FIG. 9 has diagonally extending rows and columns of display pixels 22 (i.e., display pixels 22 and corresponding scan lines and data lines that run along diagonal axes 62 and 64, respectively). Display pixels 22 have edges that are parallel with axes 62 and 64 rather than edges that are parallel to the horizontal and vertical edges of display substrate 24 and display 14. The subpixels 50 of display pixels 22 of FIG. 9 may include red subpixels R and green subpixels G of equal areas and blue subpixels B with areas that are 2-3 times as large as the areas of the red subpixels R (and that are 2-3 times as large as the areas of the green subpixels G). The edges of the rectangular subpixels 50 in display pixels 22 may run parallel to diagonally extending axes 62 and 64 (i.e., the edges of rectangular subpixels 50 are angled at 45° angles relative to horizontal and vertical edges 54 of substrate 24 and display 14).

Figure 10:
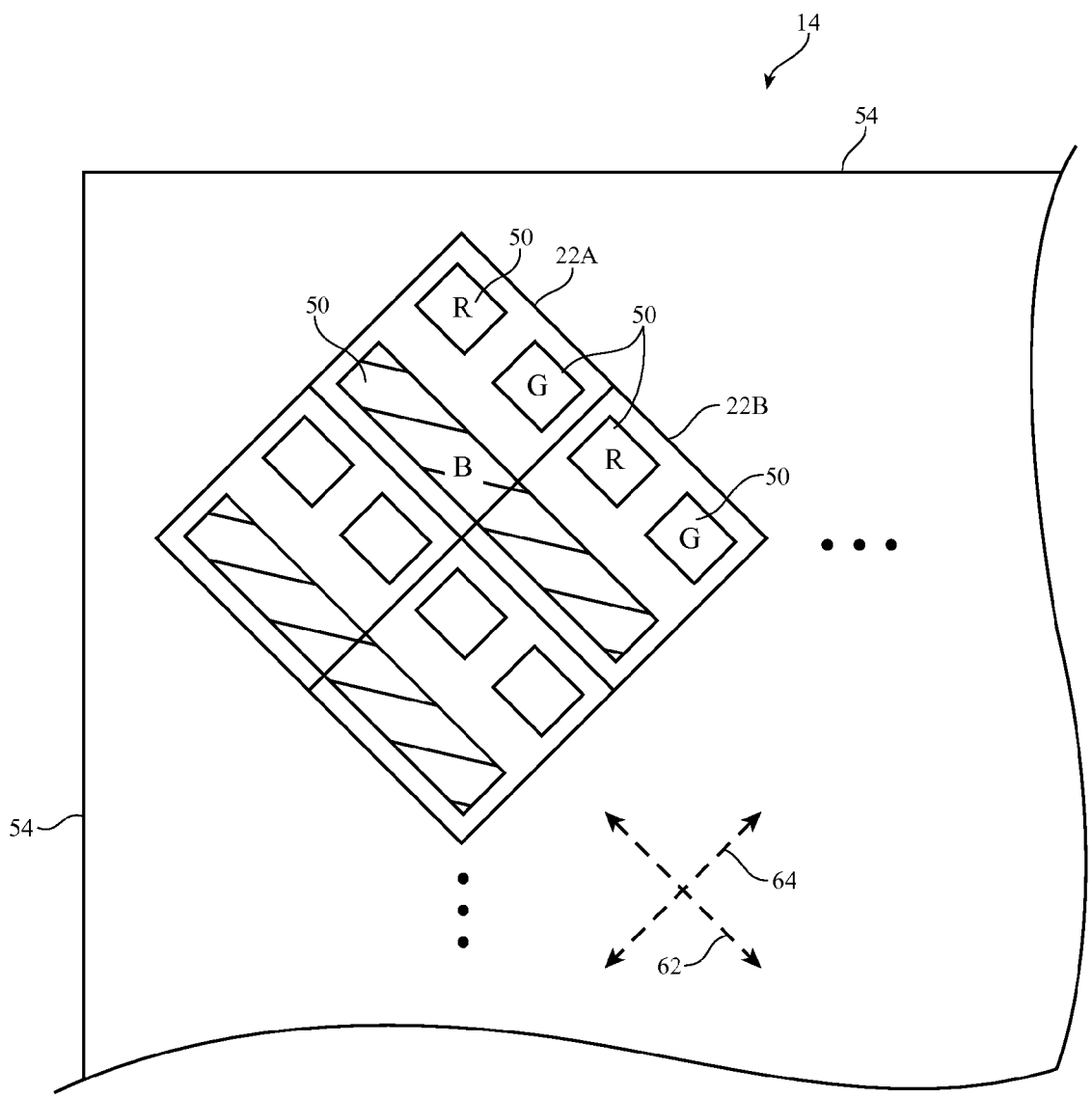
FIG. 10 is a top view of an array of display pixels that has been rotated 45° from horizontal where each pair of adjacent display pixels has a shared blue subpixel in accordance with an embodiment.

Pixel driving complexity can be reduced by sharing subpixels between adjacent display pixels 22. In the illustrative rotated display pixel array of FIG. 10, blue subpixels B have elongated rectangular shapes that are sufficiently large to extend between pairs of adjacent display pixels 22. As shown in display 14 of FIG. 10, for example, a single blue subpixel B may extend across the boundary between adjacent display pixels 22A and 22B (i.e., blue subpixel B may be shared between display pixel 22A and display pixel 22B), Because pairs of adjacent display pixels 22 such as display pixel 22A and display pixel 22B may share blue subpixels such as blue subpixel B, the amount of blue subpixel driving circuitry in display 14 may be minimized.

Figure 11:
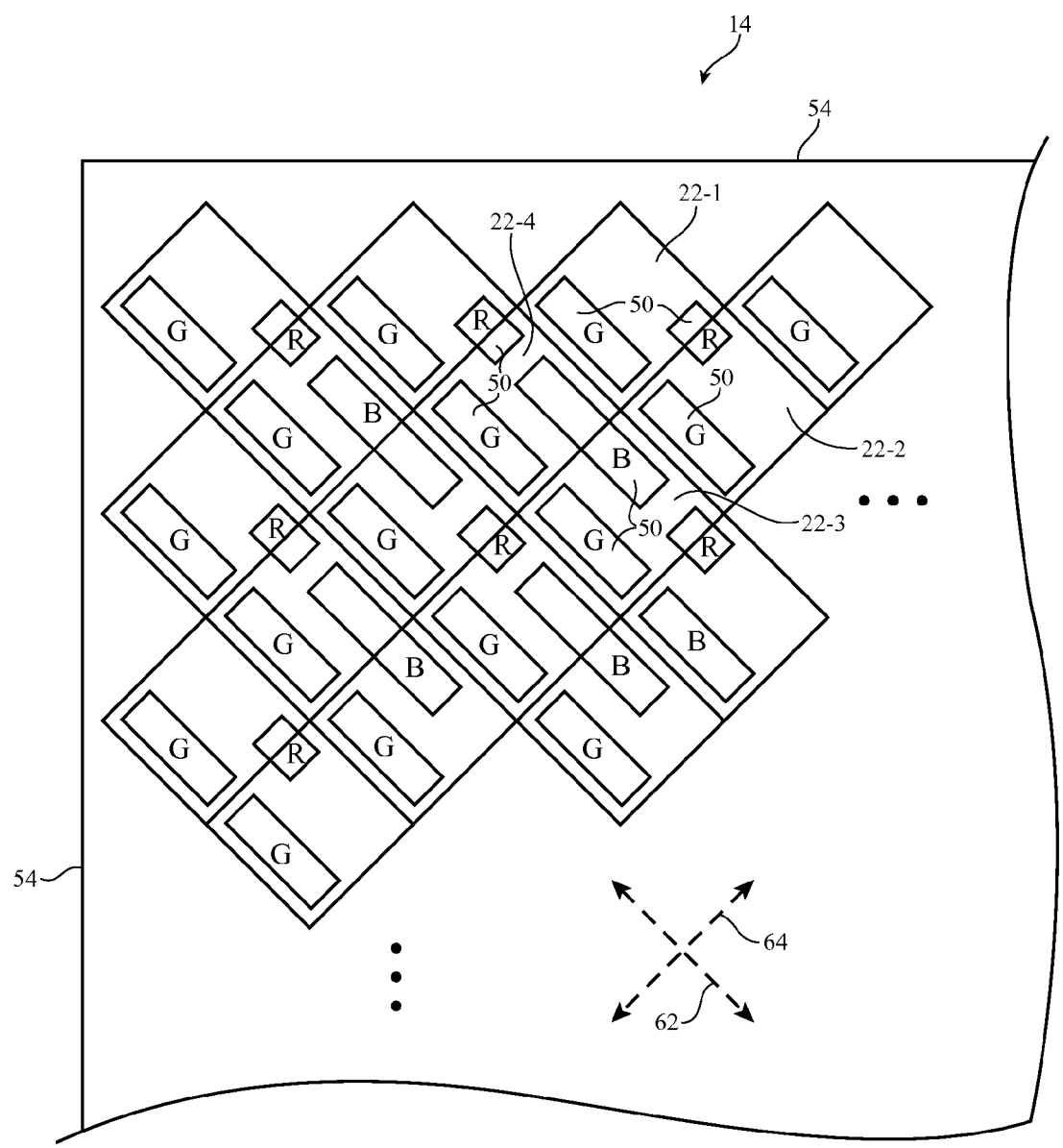
FIG. 11 is a top view of an array of display pixels that has been rotated 45° from horizontal where pairs of adjacent display pixels have shared blue subpixels with elongated rectangular shapes and where pairs of adjacent display pixels have shared red subpixels in accordance with an embodiment.

Another illustrative subpixel sharing scheme that may be used for display 14 is shown in FIG. 11. In the example of FIG. 11, red subpixels R are shared between adjacent display pixels and blue subpixels B are shared between adjacent display pixels. Green subpixels (can be individually driven arid are nut shared between adjacent display pixels in this arrangement, The human eye is sensitive to green tight, so retaining independent control of the green subpixels can help improve apparent image quality. Display 14 of FIG. 11 contains blocks of four display pixels such as display pixels 22-1, 22-2, 22-3, and 22-4. Red subpixels R are shared between adjacent display pixels such as display pixel 22-1 and 22-2 (i.e., a red subpixel R overlaps the shared edge between display pixels 22-1 and 22-2), Each of display pixels 22-1, 22-2, 22-3, and 22-4 has a separate respective green subpixel G. Blue subpixels B are shared between adjacent display pixels such as display pixels 22-3 and 22-4.

Figure 12:
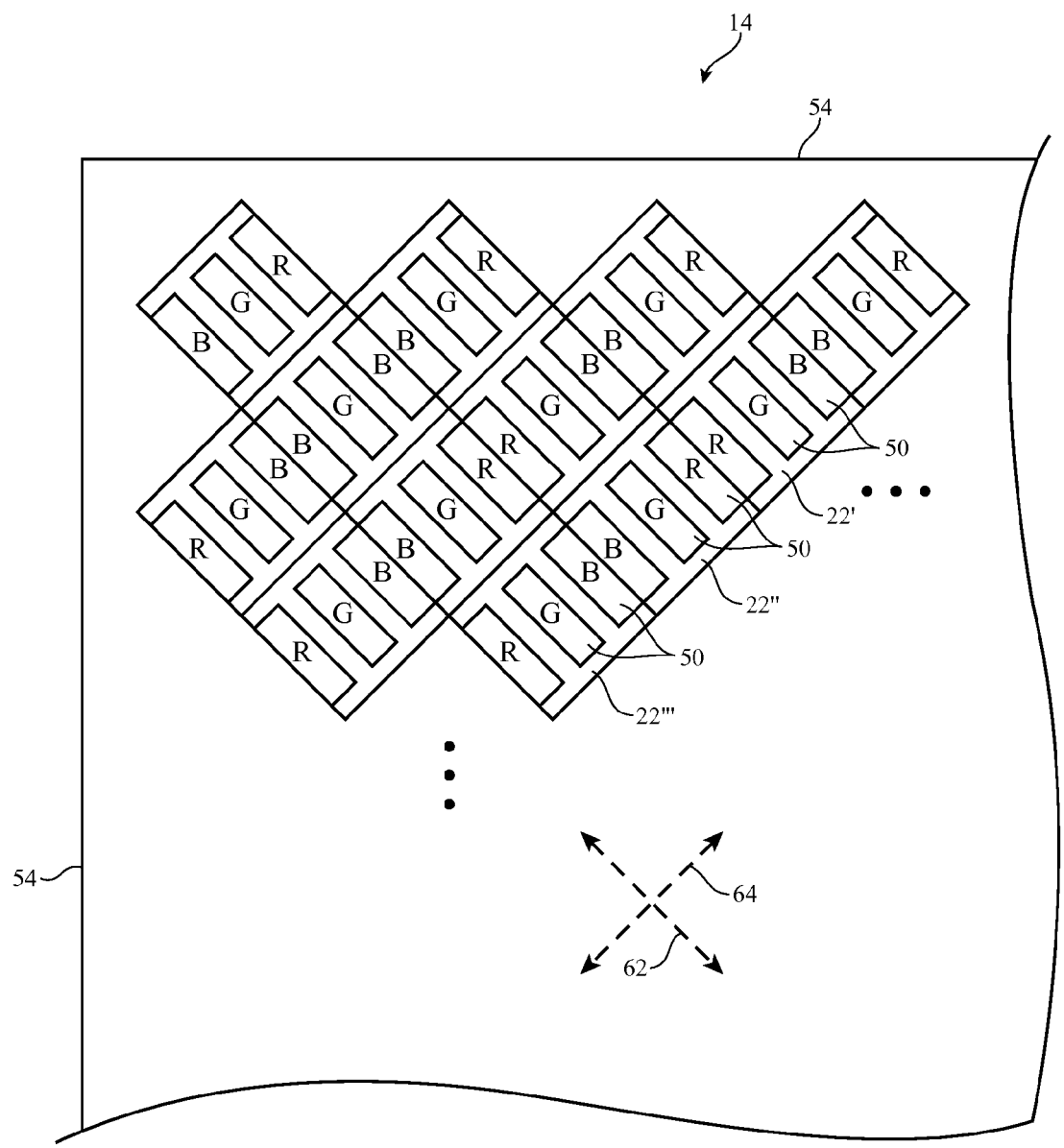
FIG. 12 is a top view of an array of display pixels that has been rotated 45° from horizontal where pairs of adjacent display pixels have shared blue subpixels and in which pans of adjacent display pixels have shared red subpixels in accordance with an embodiment.

Another layout for sharing red and blue subpixels between adjacent display pixels in a display with an array of display pixels that has been angled at 45° with respect to horizontal (and therefore the edges of display 14 and display substrate 24) is shown in FIG. 12. With the arrangement of FIG. 12, red subpixels can be shared between adjacent display pixels 22 such as display pixels 22 and 22" and green subpixels can be shared between adjacent display pixels 22 such as display pixels 22" and 22". The areas of the red, green, and blue subpixels in display 14 of FIG. 12 (and FIGS. 7-11) can be configured to have any suitable ratio (e.g., 1:1:2.5 or other ratio).

The foregoing is merely illustrative and various modifications can be made by those skilled in the in without departing from the scope and spirit of the described embodiments. The foregoing embodiments may be implemented individually or in any combination.

What is claimed is:

1. An organic light-emitting diode display, comprising:
an array of display pixels, including hexagonal red subpixels, hexagonal green subpixels, and blue subpixels, wherein the blue subpixels each include a pair of joined blue subpixel structures, and wherein each pair of joined blue subpixel structures comprises a pair of joined anodes.

2. The organic light-emitting diode display defined in claim 1 wherein the joined blue subpixel structures of each display pixel are a pair of joined hexagonal blue subpixel structures.

3. The organic light-emitting diode display defined in claim 1 wherein the joined blue subpixel structures of each display pixel are a pair of joined diamond blue subpixel structures.

4. The organic light-emitting diode display defined in claim 3 wherein the joined diamond blue subpixel structures of each blue subpixel are joined by a connector and wherein each green subpixel is vertically aligned along a horizontal axis with a respective connector.

5. The organic light-emitting diode display defined in claim 1 wherein the blue subpixels each include at least one diamond-shaped blue subpixel structure.

6. An organic light-emitting diode display, comprising:
a substrate having horizontal and vertical edges;
an array of display pixels, including red subpixels, green subpixels, and blue subpixels, wherein the array of display pixels is angled at 45° relative to horizontal so that the display pixels extend diagonally relative to the horizontal and vertical edges, and wherein the red subpixels are rectangular and have edges that are angled at 45° relative to the horizontal and vertical edges.

7. The organic light-emitting diode display defined in claim 6 wherein the blue subpixels are rectangular and have edges that are angled at 45° relative to the horizontal and vertical edges.

8. The organic light-emitting diode display defined in claim 7 wherein the green subpixels are rectangular and have edges that are angled at 45° relative to the horizontal and vertical edges.

9. The organic light-emitting diode display defined in claim 8 wherein each blue subpixel is shared between a respective pair of adjacent display pixels in the array of display pixels.

10. The organic light-emitting diode display defined in claim 9 wherein each blue subpixel has an elongated rectangular shape that extends between the pair of adjacent display pixels.

11. The organic light-emitting diode display defined in claim 10 wherein each red subpixel is shared between a respective pair of adjacent display pixels in the array of display pixels.

12. The organic light-emitting diode display defined in claim 11 wherein the green subpixels are individually controlled so that each display pixel has a respective green subpixel that is not shared with other display pixels in the array of display pixels.

13. An organic light-emitting diode display, comprising:
a substrate having horizontal and vertical edges; and
an array of display pixels having subpixels of different colors, wherein the array of display pixels is angled at 45° relative to horizontal so that the display pixels extend diagonally relative to the horizontal and vertical edges, wherein the subpixels are rectangular and have edges that are angled at 45° relative to the horizontal edges.

14. The organic light-emitting diode display defined in claim 13 wherein some of the subpixels have a given color and wherein the subpixels of the given color are each shared between a respective pair of adjacent display pixels in the array of display pixels.

15. The organic light-emitting diode display defined in claim 13 wherein the subpixels include red subpixels, green subpixels, and blue subpixels and wherein the red subpixels are each shared between a respective pair of adjacent display pixels in the array of display pixels.

16. The organic light-emitting diode display defined in claim 15 wherein the blue subpixels are each shared between a respective pair of adjacent display pixels in the array of display pixels.

17. The organic light-emitting diode display defined in claim 16 wherein the green subpixels are independently driven and are not shared between adjacent display pixels in the array of display pixels.

\* \* \* \* \*